United States Patent
Saunier et al.

(10) Patent No.: US 8,350,295 B1
(45) Date of Patent: Jan. 8, 2013

(54) DEVICE STRUCTURE INCLUDING HIGH-THERMAL-CONDUCTIVITY SUBSTRATE

(75) Inventors: Paul Saunier, Addison, TX (US); Edward Beam, Plano, TX (US); Deep Dumka, Richardson, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 99 days.

(21) Appl. No.: 12/030,594

(22) Filed: Feb. 13, 2008

(51) Int. Cl.
*H01L 29/66* (2006.01)
(52) U.S. Cl. ............ 257/194; 257/552; 257/E21.403; 257/E29.033; 438/167; 438/235
(58) Field of Classification Search .......... 257/194, 257/552, 553, 554, 555, 556, 557, 558, 559, 257/560, 561, 562, E21.403, E21.407, E29.033, 257/E29.246, E29.252, E29.523; 438/167, 438/172, 235, 236
See application file for complete search history.

(56) References Cited

U.S. PATENT DOCUMENTS

| | | | |
|---|---|---|---|
| 7,655,963 B2 * | 2/2010 | Sadaka et al. | 257/194 |
| 7,749,863 B1 * | 7/2010 | Micovic | 438/459 |
| 2003/0064535 A1 * | 4/2003 | Kub et al. | 438/22 |
| 2005/0285098 A1 * | 12/2005 | Fathimulla et al. | 257/20 |
| 2006/0049485 A1 * | 3/2006 | Pan et al. | 257/565 |
| 2007/0187717 A1 * | 8/2007 | Sadaka et al. | 257/192 |
| 2009/0072272 A1 * | 3/2009 | Suh et al. | 257/194 |

* cited by examiner

*Primary Examiner* — William D Coleman
*Assistant Examiner* — Su Kim
(74) *Attorney, Agent, or Firm* — Schwabe Williamson & Wyatt

(57) ABSTRACT

Methods and apparatuses for forming a device structure including a high-thermal-conductivity substrate are disclosed herein. A method forming such a device structure may comprise forming an active layer over a first substrate in a manner such that a frontside of the active layer faces the first substrate and a backside of the active layer faces away from the first substrate, forming a second substrate over the backside of the active layer, and removing the first substrate to expose the frontside of the active layer. Other embodiments are described and claimed.

10 Claims, 5 Drawing Sheets

DEVICE STRUCTURE INCLUDING HIGH-THERMAL-CONDUCTIVITY SUBSTRATE

TECHNICAL FIELD

Embodiments of the present invention relate generally to microelectronic devices including high-thermal-conductivity substrates, and their application to microwave- and millimeter-wave circuits and apparatuses.

BACKGROUND

In the current state of technology, there has been an increased demand for devices with high power density. The requirements for devices such as microwave- and millimeter-wave devices, for example, are becoming increasingly stringent. To accommodate such demands, high-voltage gallium arsenide technology has been used with favorable results. Problematic, however, is the heat output attendant with increasing voltages.

There have been several approaches for dealing with the increased heat output experienced with high-voltage devices. In one approach, a handle material (e.g., a handle wafer) is bonded to a frontside of an active epitaxial structure, while the backside of the epitaxial structure is composed of a low-thermal-conductivity substrate (e.g., a gallium arsenide substrate). The substrate may be ground away and in its place a high-thermal-conductivity material may be bonded. The handle material may be removed, resulting in the epitaxial structure being formed on the high-thermal-conductivity material instead of the original low-thermal-conductivity substrate. Although this approach may result in a device better able to sink the heat output, the complexity of the process may be undesirable.

In another approach, the active epitaxial structure is simply formed on the high-thermal-conductivity material instead of on the low-thermal-conductivity substrate. Although this approach is less complex than one using an intermediate handle material, it may result in an inferior device due to the lattice mismatch between the epitaxial structure and the high-thermal-conductivity substrate.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element.

Various embodiments of the present invention are directed to methods and apparatuses for forming a device structure including a high-thermal-conductivity substrate. Relative to various methods known in the related art, this novel method may reduce the number of processing operations and/or may obviate the need for using a handle wafer for forming a device structure on a high-thermal-conductivity substrate. Moreover, the device structure may be formed prior to bonding to the high-thermal-conductivity substrate, which may avoid problems (e.g., stress) associated with thermal expansion mismatches between the device structure layers and the high-thermal-conductivity substrate.

Figure 1:
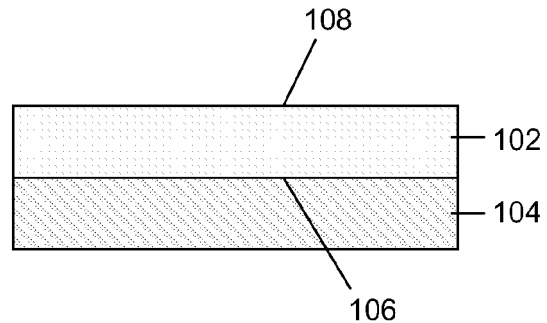
FIGS. 1-3 illustrate various stages of a method for forming a device structure including a high-thermal-conductivity substrate in accordance with various embodiments of the present invention.
Figure 2:
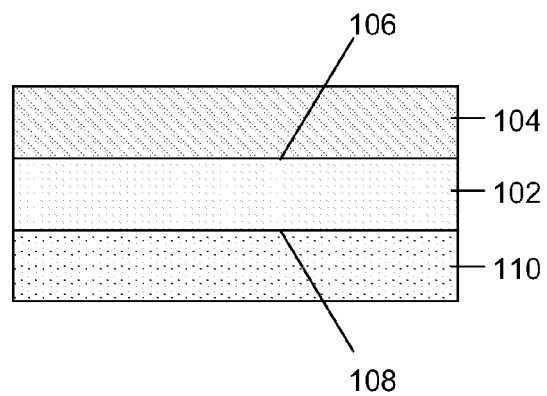
Figure 3:
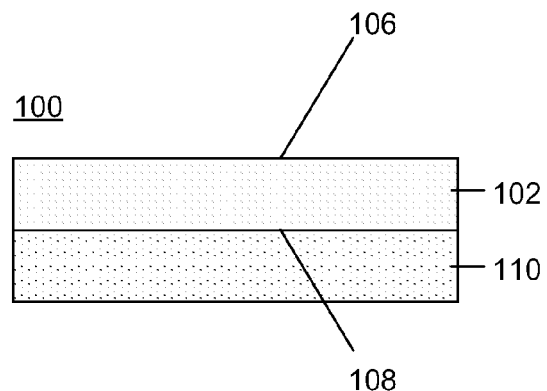

An exemplary method in accordance with the present invention is illustrated at FIGS. 1-3 by way of cross-sectional side views of a device structure 100 at various stages of the method. As illustrated at FIG. 1, an active layer 102 is formed over a first substrate 104, with a frontside 106 facing substrate 104 and a backside 108 facing away from substrate 104. Then, a second substrate such as, for example, a high-thermal-conductivity substrate 110 is formed over backside 108 of active layer 102, as illustrated at FIG. 2. Device structure 100 is formed as illustrated at FIG. 3 by removing substrate 104 to expose frontside 106 of active layer 102.

By orienting active layer 102 such that frontside 106 faces substrate 104 (rather than away from substrate 104), active layer 102 is essentially formed on substrate 104 in an "inverted" manner relative to the desired orientation of active layer 102 in device structure 100. Thus, when substrate 104 is removed, active layer 102 remains with frontside 106 facing away from high-thermal-conductivity substrate 110.

Active layer 102 may comprise any one or more layers suitable for providing the desired functionality of device structure 100. For example, in various embodiments, active layer 102 may comprise one or more layers of a heterojunction bipolar transistor (HBT) device or a pseudomorphic high electron mobility transistor (pHEMT) device as discussed more fully below. Various embodiments of the present invention may be similarly suitable for other device layers.

Substrate 104 may comprise any substrate known in the art. For example, substrate 104 may comprise, in various embodiments, gallium arsenide (GaAs). In other embodiments, however, substrate 104 may comprise gallium nitride (GaN), indium phosphide (InP), or another material or combination of materials suitable for the application. For example, substrate 104 may comprise silicon carbide, silicon, sapphire, aluminum nitride, or some combination thereof or some combination with another suitable material.

Removal of substrate 104 (for example, as illustrated at FIG. 3) may be accomplished according to any method suitable for the purpose. Substrate 104 may be removed, for example, by grinding, chemical etch, or chemical and mechanical planarization (CMP).

High-thermal-conductivity substrate 110 may comprise any material known in the art having a thermal resistivity/conductivity suitable for the application. For example, high-thermal-conductivity substrate 110 may comprise polycrystalline silicon carbide (poly-SiC), which has a thermal conductivity of greater than 300 Watts/meter·Kelvin (W/m·K) (compared to a GaAs substrate having a thermal conductivity of about 50 W/m·K). Other suitable materials for high-thermal-conductivity substrate 110 may comprise diamond (thermal conductivity of about 700-1000 W/m·K), aluminum nitride (AlN) (thermal conductivity of up to about 300 W/m·K), or another material or combination of materials suitable for the application.

It should be noted that although methods and apparatuses described herein discuss the replacement of a substrate with a high-thermal-conductivity substrate in particular, various embodiments of the present invention may be generally suitable for any number of device types for which one substrate is replaced by another substrate. In the typical case, one substrate may be replaced by another substrate having some desirable characteristic, in which the original substrate may be deficient.

In various embodiments, a method for forming a device structure including a high-thermal-conductivity substrate may include one or more layers in addition to those illustrated at FIGS. 1-3. For example, one or more of various layers including buffer layer(s), silicon oxide layer(s), and etch stop layer(s) may be included in a method for forming a device structure in accordance with various embodiments of the present invention.

Figure 4:
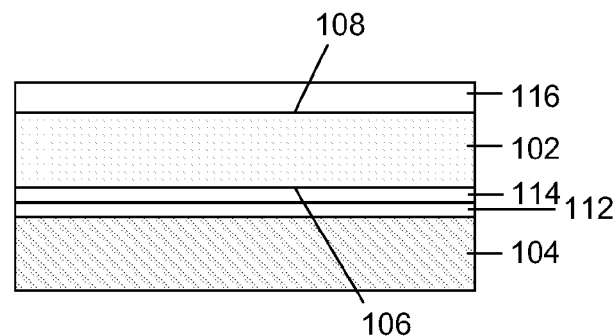
FIGS. 4-7 illustrate various stages of another method for forming a device structure including a high-thermal-conductivity substrate in accordance with various embodiments of the present invention.

As illustrated at FIG. 4, for example, a buffer layer 112 may be formed over substrate 104, and an etch stop layer 114 may be formed over buffer layer 112. Buffer layer 112 may comprise GaAs, aluminum gallium arsenide (AlGaAs), or another material or combination of materials suitable for the purpose. Etch stop layer 114 may protect active layer 102 from undesired etching and/or damage during removal of substrate 104. Etch stop layer 114 may comprise AlGaAs, indium gallium phosphide (InGaP), or another material or combination of materials suitable for the purpose. Active layer 102 may then be formed over etch stop layer 114 such that frontside 106 of active layer 102 faces etch stop layer 114.

Another buffer layer 116 may be formed over backside 108 of active layer 102. Buffer layer 116 may comprise the same or different material as that used for buffer layer 112. As with buffer layer 112, buffer layer 116 may comprise GaAs, AlGaAs, or another material or combination of materials suitable for the purpose.

Figure 5:
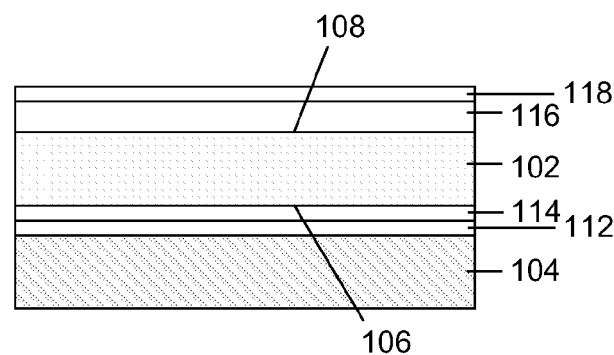
Figure 6:
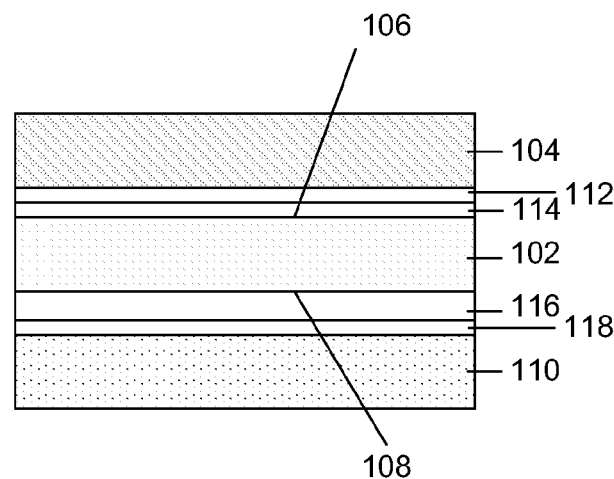

Turning now to FIG. 5, an oxide layer 118 may be formed over buffer layer 116. Oxide layer 118 may comprise silicon dioxide in various embodiments. Then, high-thermal-conductivity substrate 110 may be formed over oxide layer 118, as illustrated at FIG. 6. In various embodiments, oxide layer 118 may be formed on high-thermal-conductivity substrate 110 prior to bonding to buffer layer 116. In other embodiments, high-thermal-conductivity substrate 110 may include at least one oxide layer in addition to oxide layer 118 so that two or more oxide layers are formed between high-thermal-conductivity substrate 110 and buffer layer 116.

In various embodiments, any one or more of buffer layer 112, etch stop layer 114, buffer layer 116, and oxide layer 118 may be omitted altogether.

Figure 7:
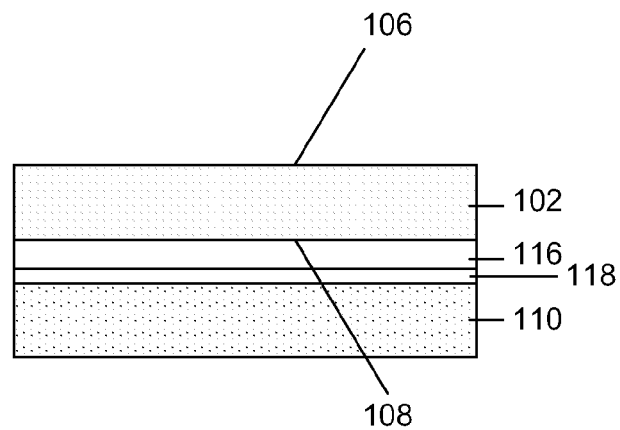

Substrate 104, buffer layer 112 (when included), and etch stop layer 114 (when included) may be removed to expose frontside 106 of active layer 102 as illustrated at FIG. 7. Removal of substrate 104, buffer layer 112, and etch stop layer 114 may be accomplished according to any method suitable for the purpose. Substrate 104 may be removed, for example, by grinding, chemical etch, or chemical and mechanical planarization (CMP). Similarly, buffer layer 112 and etch stop layer 114 may be removed in one or more operations including, for example, grinding, chemical etch, or chemical and mechanical planarization (CMP). Other methods may be similarly suitable.

As noted herein, active layer 102 may comprise any one or more layers an HBT device or a pHEMT device. FIGS. 8-11 illustrate various stages of an exemplary method for forming a pHEMT device structure including a high-thermal-conductivity substrate, and FIGS. 12-15 illustrate various stages of an exemplary method for forming an HBT device structure including a high-thermal-conductivity substrate. Each will be discussed in turn.

Figure 8:
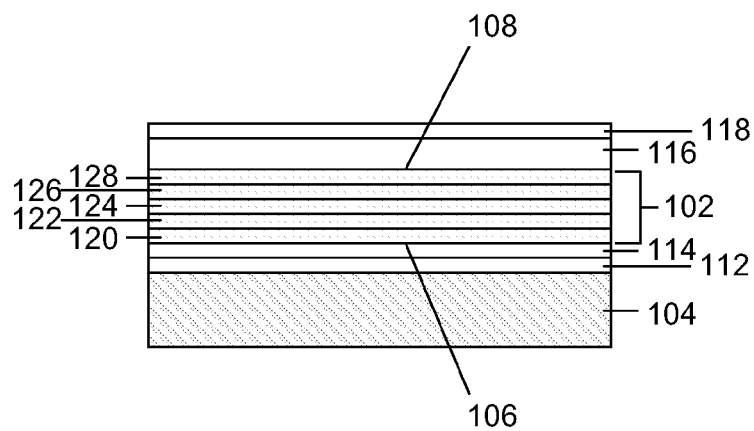
FIGS. 8-11 illustrate various stages of a method for forming a pseudomorphic high electron mobility transistor device structure including a high-thermal-conductivity substrate in accordance with various embodiments of the present invention.

A pHEMT device may be formed from an active layer 102 including one or more epitaxial layers. Accordingly, any material(s) suitable for forming a pHEMT device may be suitable for forming active layer 102. For example, as illustrated at FIG. 8, active layer 102 may comprise a contact layer 120 formed over substrate 104, a Schottky layer 122 formed over contact layer 120, a first spacer layer 124 formed over Schottky layer 122, a channel layer 126 formed over first spacer layer 124, and a second spacer layer 128 formed over channel layer 126. In an exemplary embodiment, first spacer layer 124 comprises aluminum gallium arsenide (AlGaAs), channel layer 126 comprises indium gallium arsenide (InGaAs), second spacer layer 128 comprises AlGaAs, and contact layer 120 comprises GaAs. Other materials may be similarly suitable for forming the desired pHEMT epitaxial structure. Further, various doping operations may be performed on the formed layers for achieving desired electrical properties. For example, in various embodiments, first spacer layer 124 may comprise a high bandgap uniformly- or pulse-doped layer, channel layer 126 may comprise a low bandgap uniformly- or pulse-doped layer, and second spacer layer 128 may comprise a high bandgap uniformly- or pulse-doped layer.

As discussed herein and as illustrated at FIG. 8, buffer layer 112 and/or etch stop layer 114 may be formed between active layer 102 and substrate 104. Similarly, buffer layer 116 and/or oxide layer 118 may be formed over backside 108 of active layer 102. In some embodiments, one or more of buffer layer 112, etch stop layer 114, buffer layer 116, or oxide layer 118 may be omitted altogether.

Figure 9:
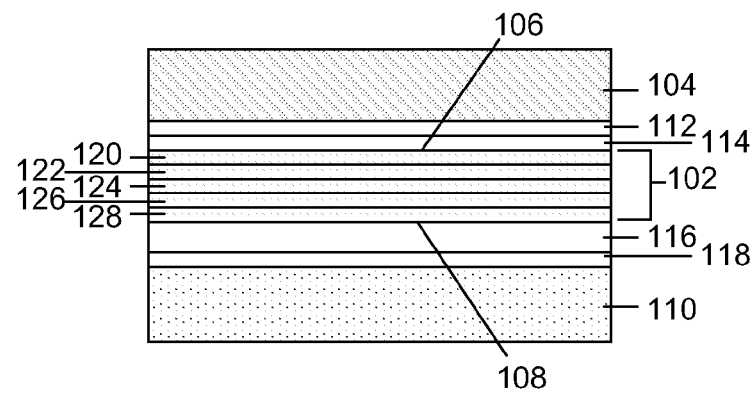
Figure 10:
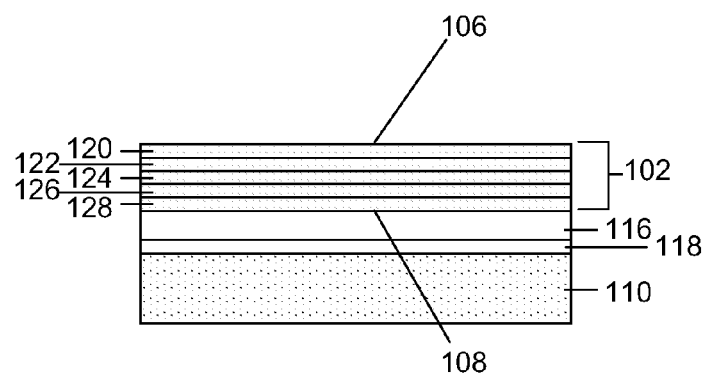

High-thermal-conductivity substrate 110 may be formed over oxide layer 118, as illustrated at FIG. 9, and then substrate 104, buffer layer 112 (when included), and etch stop layer 114 (when included) may be removed to expose frontside 106 of active layer, as illustrated at FIG. 10.

Figure 11:
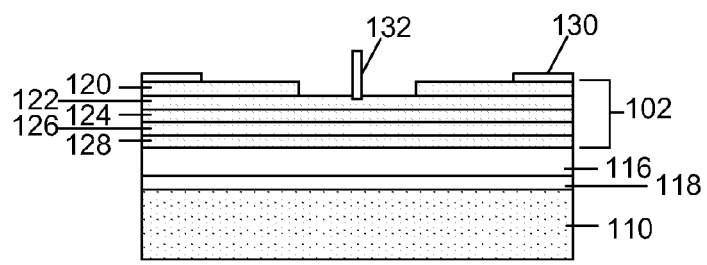

Now that the pHEMT epitaxial structure (i.e., active layer 102) is formed, subsequent operations may be performed for fully forming the desired pHEMT device such as, for example, the pHEMT device illustrated at FIG. 11. As illustrated, the pHEMT device includes source and drain contacts 130 and gate 132.

Figure 12:
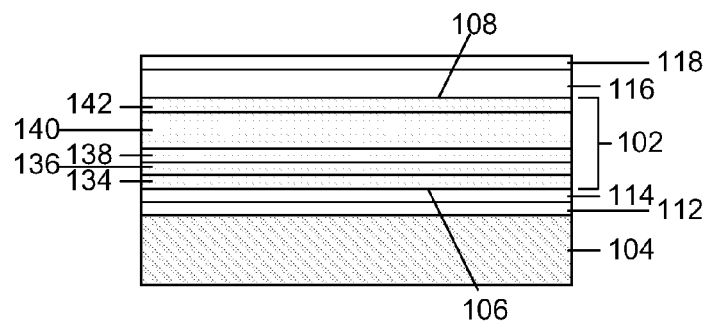
FIGS. 12-15 illustrate various stages of a method for forming a heterojunction bipolar transistor device structure including a high-thermal-conductivity substrate in accordance with various embodiments of the present invention.

FIGS. 12-15 illustrate an exemplary method for forming an HBT in accordance with the present invention. An HBT device may be formed from an active layer 102 including one or more epitaxial layers. Accordingly, any material(s) suitable for forming an HBT device may be suitable for forming active layer 102. For example, as illustrated at FIG. 12, active layer 102 may comprise one or more of a contact layer 134, an emitter layer 136 formed over the contact layer 134, a base layer 138 formed over the emitter layer 136, a collector layer 140 formed over the base layer 138, and a subcollector layer 142 formed over the collector layer 140. Although various materials may be equally suitable, in exemplary embodiments one or more of subcollector layer 142, collector layer 140, and base layer 138 may comprise GaAs, or another suitable material. Emitter layer 136 may comprise indium gallium phosphide (InGaP), AlGaAs, or another suitable material, and contact layer 134 may comprise indium gallium arsenide (InGaAs) or another suitable material.

Buffer layer 112 and/or etch stop layer 114 may be formed between active layer 102 and substrate 104. Similarly, buffer layer 116 and/or oxide layer 118 may be formed over backside 108 of active layer 102. In some embodiments, one or more of buffer layer 112, etch stop layer 114, buffer layer 116, or oxide layer 118 may be omitted altogether.

Figure 13:
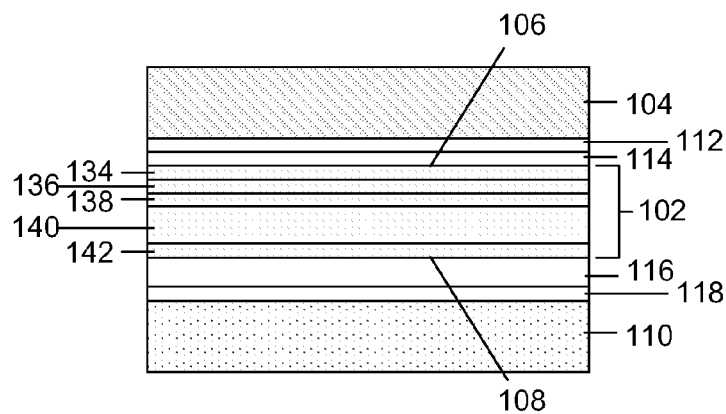
Figure 14:
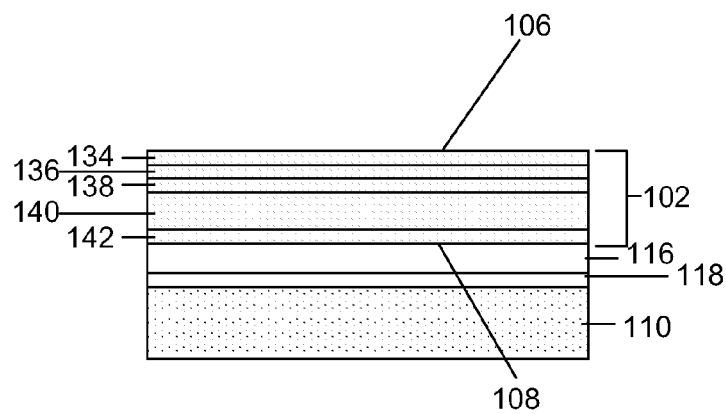

High-thermal-conductivity substrate 110 may be formed over oxide layer 118, as illustrated at FIG. 13, and then substrate 104, buffer layer 112 (when included), and etch stop layer 114 (when included) may be removed to expose frontside 106 of active layer, as illustrated at FIG. 14.

Figure 15:
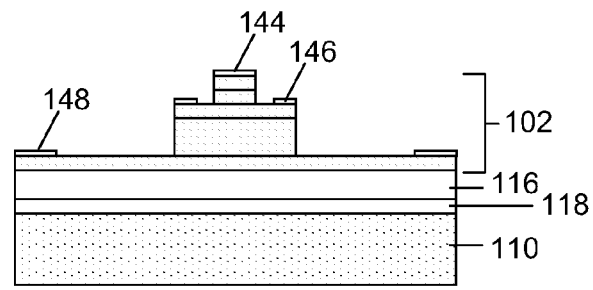

Now that the HBT epitaxial structure (i.e., active layer 102) is formed, subsequent operations may be performed for fully forming the desired HBT device such as, for example, the HBT device illustrated at FIG. 15. As illustrated, contact layer 134 and emitter layer 136 may be etched down to base layer 138 resulting in the emitter mesa structure illustrated. Base layer 138 and collector layer 140 may be etched down to subcollector layer 142 resulting in the base mesa structure illustrated.

The HBT device may be metallized for electrically interconnecting the HBT device to other devices. As illustrated, for example, the HBT device may include an emitter contact 144 formed over contact layer 134, base contacts 146 formed over base layer 138, and collector contacts 148 formed over subcollector layer 142. Emitter contact 144, base contacts 146, and collector contacts 148 may comprise any material suitable for electrically interconnecting the HBT device including, for example, a suitable metal.

Various embodiments of apparatuses disclosed herein may be incorporated into radio frequency systems for power amplification at microwave and/or millimeter wave frequencies. For example, a system incorporating a device structure formed by a method in accordance with various embodiments may be suitable for any one or more of terrestrial and satellite communications, radar systems, and possibly in various industrial and medical applications. Radar applications may include military-use radar, air traffic control, navigation, and the like. A system incorporating a device structure formed by a method in accordance with various embodiments may be a selected one of a radar device, a satellite communication device, a cellular telephone, or a cellular telephone base station.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   providing an apparatus including:
      a first substrate;
      an etch stop layer including aluminum gallium arsenide or indium gallium phosphide formed over the first substrate;
      an inverted epitaxial structure formed over etch stop layer in a manner such that the etch stop layer is between the first substrate and the inverted epitaxial structure and such that a frontside of the inverted epitaxial structure faces the etch stop layer and a backside of the inverted epitaxial structure faces away from the etch stop layer; and
      an oxide layer formed over the backside of the inverted epitaxial structure;
   after providing the apparatus, forming a second substrate over the oxide layer such that the oxide layer is between the backside of the active layer and the second substrate; and
   after said forming the second substrate, removing the first substrate and the etch stop layer to expose the frontside of the inverted epitaxial structure.

2. The method of claim 1, wherein said forming the second substrate comprises forming a high thermal conductivity material over the oxide layer.

3. The method of claim 2, wherein the high thermal conductivity material comprises a material selected from polycrystalline silicon carbide, diamond, or aluminum nitride.

4. The method of claim 1, wherein said forming of the second substrate over the oxide layer comprises wafer bonding the second substrate to the oxide layer.

5. The method of claim 1, wherein the apparatus further includes a buffer layer over the backside of the inverted epitaxial structure, wherein the oxide layer is a first oxide layer, and wherein the apparatus further includes a second oxide layer between the second substrate and the buffer layer.

6. The method of claim 1, wherein the inverted epitaxial structure comprises a pseudomorphic high-electron-mobility transistor (pHEMT) structure or a heterojunction bipolar transistor (HBT) structure.

7. The method of claim 6, wherein the pHEMT structure comprises:
   forming a contact layer over the first substrate;
   forming a Schottky layer over the contact layer such that the contact layer is between the Schottky layer and the first substrate;

forming a first spacer layer over the Schottky layer such that the Schottky layer is between the first spacer layer and the contact layer;

forming a channel layer over the first spacer layer such that the first spacer layer is between the channel layer and the Schottky layer; and forming a second spacer layer over the channel layer such that the channel layer is between the second spacer layer and the first spacer layer.

8. The method of claim 7, wherein the Schottky layer, the first spacer layer, and the second spacer layer each comprise aluminum gallium arsenide, and wherein the channel layer comprises indium gallium arsenide.

9. The method of claim 6, wherein the HBT structure comprises:

forming a contact layer over the first substrate;

forming an emitter layer over the contact layer such that the contact layer is between the emitter layer and the first substrate;

forming a base layer over the emitter layer such that the emitter layer is between the base layer and the contact layer;

forming a collector layer over the base layer such that the base layer is between the collector layer and the emitter layer; and forming a subcollector layer over the collector layer such that the collector layer is between the subcollector layer and the base layer.

10. The method of claim 9, wherein the base layer, the collector layer, and the subcollector layer each comprise gallium arsenide, wherein the contact layer comprises indium gallium arsenide, and wherein the emitter layer comprises indium gallium phosphide.

* * * * *